United States Patent
Peinador et al.

(10) Patent No.: US 6,358,359 B1
(45) Date of Patent: Mar. 19, 2002

(54) APPARATUS FOR DETECTING PLASMA ETCH ENDPOINT IN SEMICONDUCTOR FABRICATION AND ASSOCIATED METHOD

(75) Inventors: Jose A. Peinador; Juan Guillermo Verges Gonzalez, both of Madrid (ES)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/432,926

(22) Filed: Nov. 3, 1999

(51) Int. Cl.[7] .......................... H01L 21/00; G01N 21/00
(52) U.S. Cl. ....................................................... 156/345
(58) Field of Search .......................... 156/345; 216/60; 438/9; 204/298.32, 298.03, 192.13, 192.33

(56) References Cited

U.S. PATENT DOCUMENTS

| | | | |
|---|---|---|---|
| 5,695,660 A | 12/1997 | Litvak | 216/85 |
| 5,728,253 A * | 3/1998 | Saito et al. | 156/345 |
| 5,759,424 A * | 6/1998 | Imatake et al. | 156/345 |
| 5,846,373 A | 12/1998 | Pirkle et al. | 156/345 |
| 5,888,337 A | 3/1999 | Saito | 156/345 |
| 5,891,352 A | 4/1999 | Litvak | 216/85 |
| 5,946,082 A | 8/1999 | Litvak et al. | 356/72 |
| 6,207,008 B1 * | 3/2001 | Kijima | 156/345 |

* cited by examiner

Primary Examiner—Thi Dang
(74) Attorney, Agent, or Firm—Allen, Dyer, Doppelt, Milbrath & Gilchrist, P.A.

(57) ABSTRACT

An apparatus for semiconductor processing reduces etch endpoint interference by analyzing the plasma while excluding reflections from the semiconductor wafer. The apparatus includes a chamber having a semiconductor substrate holder, a plasma generator, and a window. An optical fiber is connected to the window so as to be optically connected to the plasma from outside the chamber. A processor is connected to a second end of the optical fiber for analyzing the plasma. The window has a substantially planar portion and a substantially tubular portion extending outwardly therefrom. The tubular window portion has a closed end opposite the planar window portion, and the optical fiber is connected to the closed end of the tubular window portion. The tubular window portion is positioned at a predetermined angle relative to the planar window portion so as to be optically coupled to view the plasma, while avoiding reflections from the semiconductor substrate to thereby reduce the interference.

27 Claims, 4 Drawing Sheets

APPARATUS FOR DETECTING PLASMA ETCH ENDPOINT IN SEMICONDUCTOR FABRICATION AND ASSOCIATED METHOD

FIELD OF THE INVENTION

The present invention relates to the field of semiconductor wafer processing and, more particularly, to monitoring plasma etching.

BACKGROUND OF THE INVENTION

Plasma etching is a well known dry etching process in the art of semiconductor fabrication. It is also known that the endpoint of a plasma etching process may be determined by monitoring the level of emission of selected byproducts of the etching reaction. For example, an endpoint detector may be used for detecting byproducts of the etched layer in the exhaust stream of the etching chamber. The etching process is stopped when no more byproduct is detected.

Endpoint detection may also rely on light emitted by the plasma during the etching reaction. This light includes emissions at wavelengths representative of specific substances present in the plasma. Therefore, the level of a reaction byproduct may be monitored through measurement of emissions at the byproduct's particular emission wavelength. By monitoring the level of a byproduct which originates from the layer being removed by the etching, the endpoint of the process is indicated by a sharp drop in the level of emitted reaction product. For example, in a plasma etching process wherein a layer of oxide is being removed, carbon monoxide (CO) is a typical byproduct released into the plasma. CO emits light at a wavelength of 483 nm. Therefore, when the oxide layer is fully removed, the CO emission decreases indicating the endpoint of the etch process.

In making such emissions measurements, however, it is expected that etching of the oxide layer would appear to proceed at a fairly constant rate. Accordingly, CO emissions would also be expected to be fairly constant. Contrary to the expected result, however, in practice measurement of CO emissions displays a modulation having a period about equal to the time needed for etching a thickness of about half the wavelength used to detect the CO endpoint. This effect has been noted when measuring this byproduct at various wavelengths, so that the effect is independent of the wavelength. Modulation in the measured emission level results in a signal trace having peaks and valleys, making endpoint determination more difficult.

Experimental evidence indicates that the unexpected modulation in emissions measurements is due to wavelength interference produced by reflection of light from at least two levels on the wafer. Photons from the plasma are partially reflected and transmitted at the wafer surface. Photons reflected at the wafer surface produce a first reflection. The transmitted photons are then reflected at the silicon interface, forming a second reflection. The difference in the length of the optical paths for the first and second reflections produces an interference between the two reflections. When the extra distance traveled by the second reflection is an even multiple of one fourth of the wavelength, the interference is constructive. When the extra distance of travel is an odd multiple, the interference is destructive. This interference effect explains the inconsistent behavior of the signals observed.

The interference makes endpoint determination more difficult because an apparent drop in the emission being measured may be an artifact due to the modulation effect, rather than a true decrease indicating the endpoint of the etching process. This uncertainty causes an imprecise endpoint determination and contributes to reduced accuracy and quality control problems in the etching process.

SUMMARY OF THE INVENTION

In view of the foregoing background, it is therefore an object of the invention to provide an apparatus and method for increasing the precision of endpoint determinations in a plasma etching process for semiconductor wafer fabrication.

It is another object of the present invention to provide etch endpoint determinations which are consistent and reproducible as required in a semiconductor production environment.

These and other objects, features and advantages in accordance with the present invention are provided by a semiconductor processing apparatus which eliminates this interference by analyzing the plasma while excluding reflections from the semiconductor wafer. The apparatus includes a chamber having a window. The chamber has a substrate holder within for holding a semiconductor substrate. The chamber, which is a plasma etching chamber, also includes a plasma generator for generating a plasma within the chamber. An optical fiber having opposing first and second ends, is positioned adjacent the window such that the first end is optically coupled to the plasma from outside the chamber. However, the optical fiber is positioned to avoid reflections from the semiconductor substrate. A processor is connected to the second end of the optical fiber for analyzing the plasma.

In a preferred embodiment, the chamber window has a substantially planar portion and a substantially tubular portion extending outwardly therefrom. The tubular window portion has a closed end opposite the planar window portion. The first end of the optical fiber is connected to the closed end of the tubular window portion. Advantageously, the tubular window portion is positioned at a predetermined angle relative to the planar window portion so as to be optically coupled to view the plasma, while avoiding reflections from the semiconductor substrate to thereby eliminate the interference. Any angle sufficient to avoid reflections from the wafer may be employed in the apparatus, with an angle of about 60° from the planar window portion being a preferred angle.

A method aspect of the invention for semiconductor processing includes generating a plasma within a chamber having a window, connecting an optical fiber to the window so as to be optically coupled to the plasma while avoiding reflections from the semiconductor substrate, and processing signals from the optical fiber for analysis of the plasma.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art.

Figure 1:
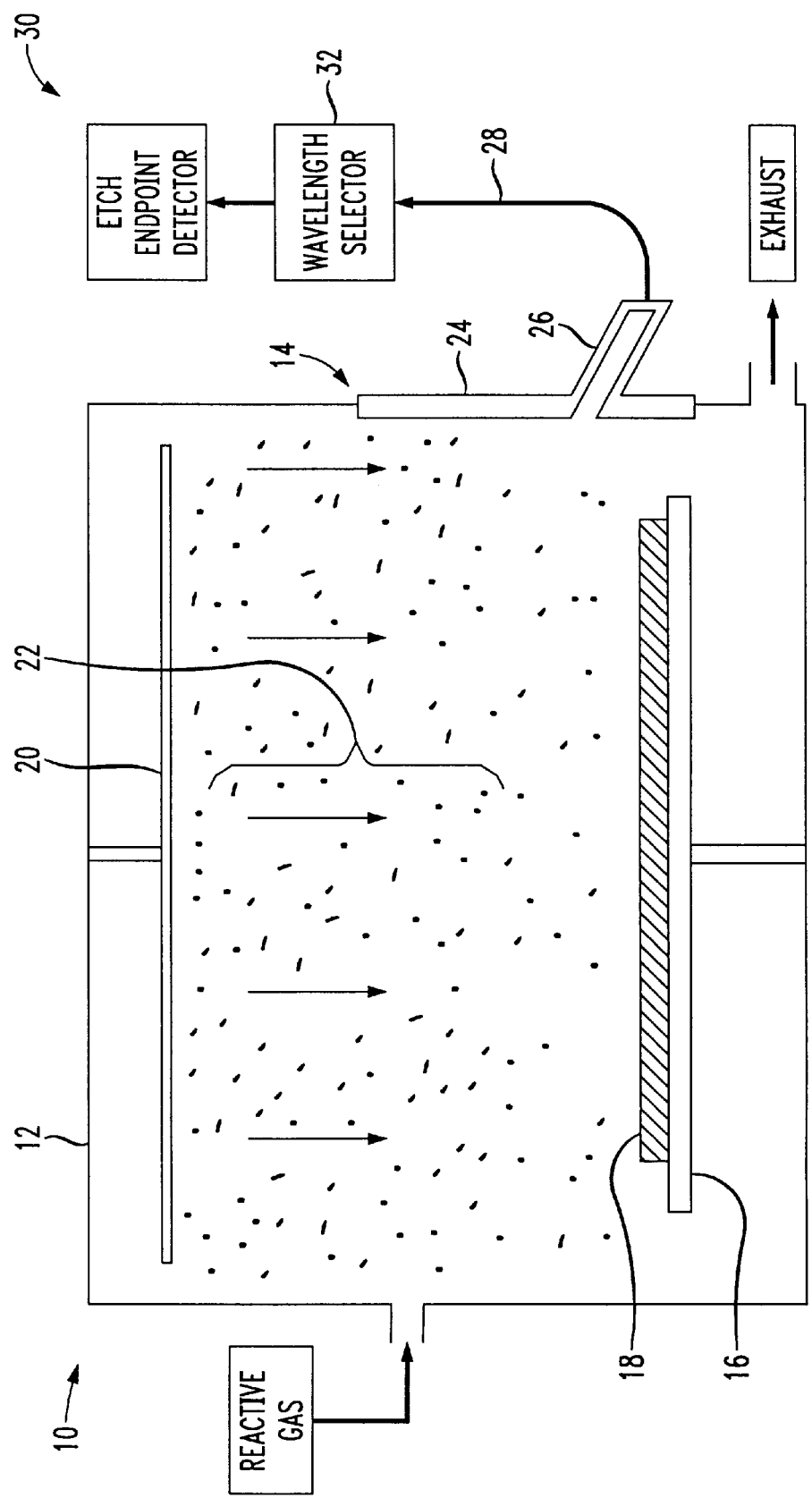
FIG. 1 is a schematic cross-sectional view of the semiconductor processing apparatus in accordance with the present invention.
Figure 2:
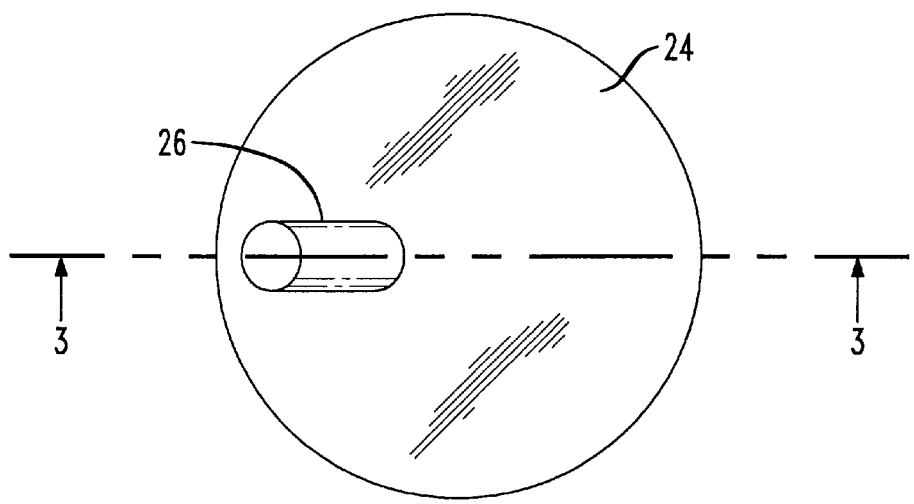
FIG. 2 is a top plan view of the window of the apparatus shown in FIG. 1.
Figure 3:
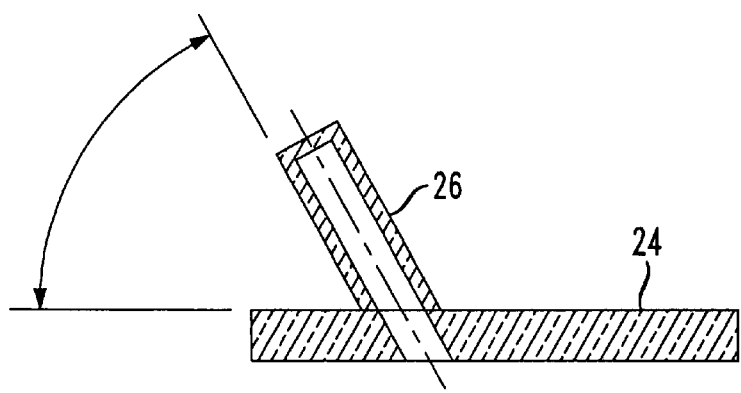
FIG. 3 is a cross-section taken along lines 3—3 of FIG. 2.

Various aspects of the present invention are seen illustrated in FIGS. 1–4. FIG. 1 particularly illustrates in schematic view a semiconductor wafer processing apparatus 10 according to a preferred embodiment of the invention. The semiconductor processing apparatus 10 includes a chamber 12 having an opening with a window 14 therein. A substrate holder 16 is positioned within the chamber 12 for holding a semiconductor substrate 18 thereon. A plasma generator 20 is located within the chamber 12 for generating a plasma 22 adjacent the semiconductor substrate 18. Of course, a remote plasma generator could also be used.

An optical fiber 28 having opposing first and second ends, has the first end positioned adjacent the window 14 such as to be optically coupled to the plasma 22 from outside the chamber 12, while avoiding reflections from the semiconductor substrate 18. A processor 30 is connected to the second end of the optical fiber 28 for analyzing the plasma. The processor 30 preferably includes a plasma etch endpoint detector configured for detecting a semiconductor processing byproduct serving to monitor the endpoint, for example CO.

Figure 4:
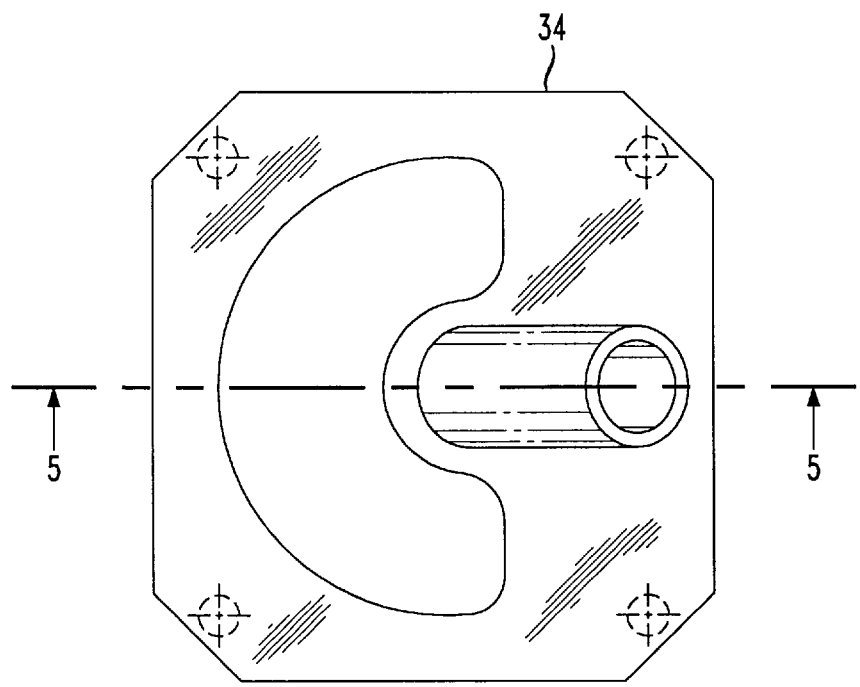
FIG. 4 is a top plan view of the supporting bracket of the apparatus shown in FIG. 1.
Figure 5:
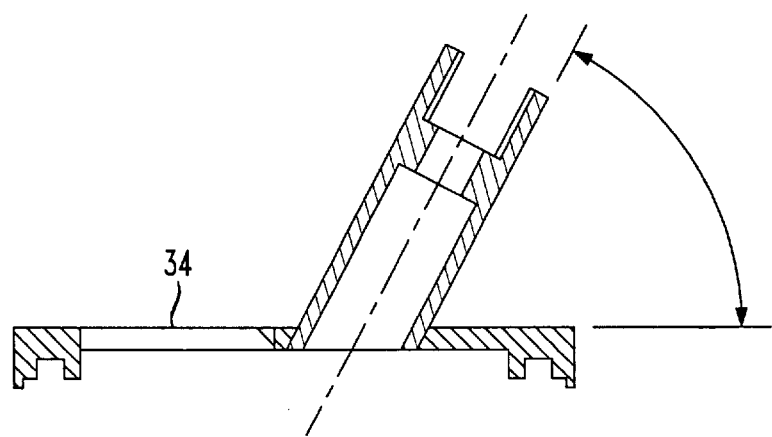
FIG. 5 is a cross-section taken along lines 5—5 of FIG. 4.

In a preferred embodiment of the apparatus 10, the window 14 includes a substantially planar window portion 24 and a substantially tubular window portion 26 extending outwardly therefrom. The window 14, is preferably a quartz window for allowing the transmission of light for analysis. The tubular window portion 26 has a closed end, and the first end of the optical fiber 28 is connected to the closed end of the tubular window portion 26. The tubular window portion 26 is advantageously positioned at a predetermined angle relative to the planar window portion 24 so as to be optically coupled for viewing the plasma 22, and to avoid reflections from the semiconductor substrate 18. Those skilled in the art will understand that the predetermined angle may be varied according to requirements of the physical dimensions and structure of the surrounding apparatus, provided the tubular window portion 26 is set at an angle sufficient to exclude reflections from the semiconductor substrate 18. In a preferred embodiment as shown schematically in FIG. 1, the predetermined angle is about 60° relative to the plane of the planar window portion 24, and is set so that the tubular window portion 26 is aimed toward an upper part of the chamber 12. The skilled artisan will appreciate that the window 14 may be positioned as practicable on the chamber 12. In addition, as shown in FIGS. 4 and 5, a support bracket 34 is preferably included to secure the connection of the optical fiber 28 to the closed end of the tubular window portion 26.

The invention also preferably includes a wavelength selector 32, also referred to as a monochromator, cooperating with the processor 30. The wavelength selector 32 will be recognized by those skilled in the art to be any one of various devices for selecting the wavelength allowed to pass through for analysis. The wavelength selector 32 may be a wavelength filter, an interference filter such as a diffraction grating, or any other such device known in the art. The skilled artisan will additionally recognize that the wavelength selector 32 may be positioned relative to the apparatus anywhere practicable for selecting a wavelength for analysis. For example, the wavelength selector 32 may be a component of the processor 30, or it may be separate from the processor and positioned along the optical fiber 28, or may even be connected between the closed end of the tubular window portion 26 and the first end of the optical fiber 28. Furthermore, the wavelength selector 32 may be fixed to allow transmission of one or more predetermined wavelengths, or may be selectably adjustable to allow passage of one or more selected wavelengths.

Figure 6:
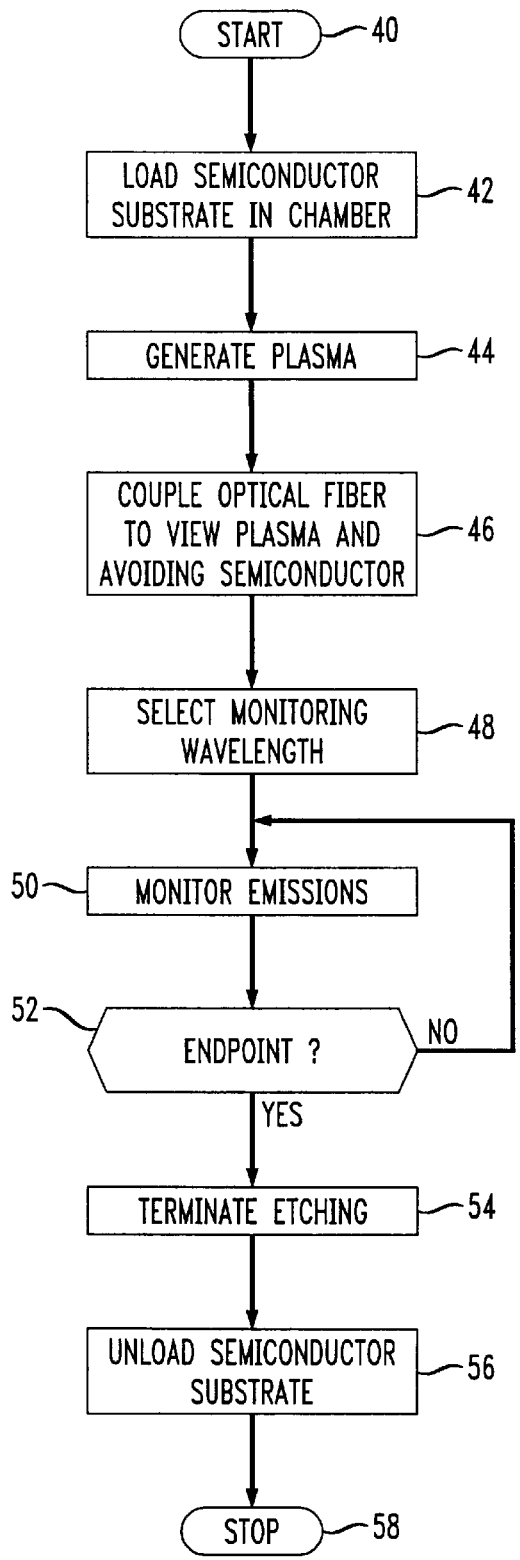
FIG. 6 is a flow chart of a method according to an embodiment of the present invention.

An additional aspect of the invention, as explained with reference to FIG. 6, is directed to a method for semiconductor processing. From the start (Block 40) the method includes the starting process step of loading a semiconductor substrate in the chamber (Block 42). At Block 44 a plasma is generated within a chamber having a window. At Block 46 an optical fiber is coupled adjacent the window such as to be optically coupled to the plasma from outside the chamber, but so as to avoid reflections from the semiconductor substrate. Subsequently, the method includes selecting a wavelength for monitoring (Block 48), and monitoring emission signals from the optical fiber (Block 50). If at Block 52 an endpoint determination is made during monitoring of emissions, then etching is terminated at Block 54. Monitoring continues until an endpoint is determined. Upon termination of etching, the semiconductor substrate is unloaded from the chamber at Block 56 and the process stops at Block 58.

Many modifications and other embodiments of the invention will come to the mind of one skilled in the art, having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed:

1. A semiconductor processing apparatus comprising:

a chamber having an opening therein;

a transparent window in the opening of said chamber, said transparent window comprising a substantially planar transparent window portion and a tubular transparent window portion connected thereto and extending outwardly therefrom, said planar transparent window portion having an opening therein and said tubular transparent window portion having an open end connected in fluid communication with the opening in said planar transparent window portion, said tubular transparent window portion having a closed end opposite the open end;

a substrate holder within said chamber for holding a semiconductor substrate thereon;

a plasma generator for generating a plasma within said chamber and adjacent the semiconductor substrate;

an optical fiber having opposing first and second ends, the first end positioned adjacent said closed end of said tubular transparent window portion such as to be optically coupled to the plasma from outside said chamber and while avoiding reflections from the semiconductor substrate; and a processor connected to the second end of said optical fiber for analyzing the plasma.

2. A semiconductor processing apparatus according to claim 1 wherein said processor comprises a plasma etch endpoint detector.

3. A semiconductor processing apparatus according to claim 1 wherein said tubular transparent window portion is positioned at a predetermined angle relative to said planar transparent window portion so as to be optically coupled to view the plasma and while avoiding reflections from the semiconductor substrate.

4. A semiconductor processing apparatus according to claim 3 wherein the predetermined angle of said tubular transparent window portion is about 60 degrees.

5. A semiconductor processing apparatus according to claim 1 wherein said processor further comprises a wavelength selector.

6. A semiconductor processing apparatus according to claim 1 wherein said transparent window comprises quartz.

7. A semiconductor processing apparatus according to claim 1 wherein said processor is for detecting a semiconductor processing byproduct in the plasma.

8. A semiconductor processing apparatus according to claim 1 wherein the opening is said chamber is positioned in a sidewall thereof.

9. A semiconductor processing apparatus according to claim 1 further comprising a supporting bracket positioned for supporting the optical fiber adjacent the closed end of the tubular transparent window portion.

10. A semiconductor processing apparatus comprising:
a chamber having an opening therein;
a transparent window in the opening of said chamber, said transparent window comprising a substantially planar transparent window portion and a tubular transparent window portion connected thereto and extending outwardly therefrom, said planar transparent window portion having an opening therein and said tubular transparent window portion having an open end connected in fluid communication with the opening in said planar transparent window portion, said tubular transparent window portion having a closed end opposite said open end;
a substrate holder within said chamber for holding a semiconductor substrate thereon;
a plasma generator for generating a plasma within said chamber and adjacent the semiconductor substrate;
an optical fiber having opposing first and second ends, the first end positioned adjacent the closed end of said tubular transparent window portion such as to be optically coupled to the plasma from outside said chamber and while avoiding reflections from the semiconductor substrate; and
a processor connected to the second end of said optical fiber for detecting a semiconductor processing byproduct in the plasma.

11. A semiconductor processing apparatus according to claim 10 wherein said processor comprises a plasma etch endpoint detector.

12. A semiconductor processing apparatus according to claim 10 wherein said tubular transparent window portion is positioned at a predetermined angle relative to said planar transparent window portion so as to be optically coupled to view the plasma and while avoiding reflections from the semiconductor substrate.

13. A semiconductor processing apparatus according to claim 12 wherein the predetermined angle of said tubular transparent window portion is about 60 degrees.

14. A semiconductor processing apparatus according to claim 10 wherein said processor further comprises a wavelength selector.

15. A semiconductor processing apparatus according to claim 10 wherein said transparent window comprises quartz.

16. A semiconductor processing apparatus according to claim 10 wherein the opening in said chamber is positioned in a sidewall thereof.

17. A semiconductor processing apparatus according to claim 10 further comprising a supporting bracket positioned for supporting the optical fiber adjacent the closed end of the tubular transparent window portion.

18. A semiconductor processing apparatus comprising:
a chamber;
a transparent window in an opening of said chamber, said transparent window comprising a substantially planar transparent window portion and a tubular transparent window portion connected thereto and extending outwardly therefrom, said planar transparent window portion having an opening therein and said tubular transparent window portion having an open end connected in fluid communication with the opening in said planar transparent window portion, said tubular transparent window portion having a closed end opposite said open end;
a substrate holder within said chamber for holding a semiconductor substrate thereon;
a plasma generator for generating a plasma within said chamber and adjacent the semiconductor substrate;
an optical fiber having opposing first and second ends, the first end positioned adjacent said closed end of said tubular transparent window portion such as to be optically coupled to the plasma from outside said chamber and while avoiding reflections from the semiconductor substrate; and
a processor comprising a plasma etch endpoint detector and connected to the second end of said optical fiber for analyzing the plasma.

19. A semiconductor processing apparatus according to claim 18 wherein said processor comprises a plasma etch endpoint detector.

20. A semiconductor processing apparatus according to claim 18 wherein said tubular transparent window portion is positioned at a predetermined angle relative to said planar transparent window portion so as to be optically coupled to view the plasma and while avoiding reflections from the semiconductor substrate.

21. A semiconductor processing apparatus according to claim 20 wherein the predetermined angle of said tubular transparent window portion is 60 degrees.

22. A semiconductor processing apparatus according to claim 18 further comprising a wavelength selector positioned to select light wavelength corresponding to a semiconductor processing byproduct for analysis by said processor.

23. A semiconductor processing apparatus according to claim 18 wherein said processor further comprises said wavelength selector.

24. A semiconductor processing apparatus according to claim 18 wherein said transparent window comprises quartz.

25. A semiconductor processing apparatus according to claim 18 wherein said processor is for detecting CO in the plasma.

26. A semiconductor processing apparatus according to claim 18 wherein the opening in said chamber is positioned in a sidewall thereof.

27. A semiconductor processing apparatus according to claim 18 further comprising a supporting bracket positioned for supporting the optical fiber adjacent the closed end of the tubular transparent window portion.

* * * * *